(12) United States Patent
Seitz et al.

(10) Patent No.: US 9,884,397 B2
(45) Date of Patent: Feb. 6, 2018

(54) CONTROL CONSOLE FOR A NUMERICALLY CONTROLLED MACHINE TOOL

(71) Applicants: DMG MORI AKTIENGESELLSCHAFT, Bielefeld (DE); DMG MORI CO., LTD., Yamatokoriyama-shi, Nara (JP)

(72) Inventors: Reinhold Seitz, Hopferau (DE); Dominic Schindler, Lauterach (AT)

(73) Assignees: DMG MORI AKTIENGESELLSCHAFT, Bielefeld (DE); DMG MORI CO., LTD., Yamatokoriyama-shi (JP)

( * ) Notice: Subject to any disclaimer, the term of this patent is extended or adjusted under 35 U.S.C. 154(b) by 0 days.

(21) Appl. No.: 15/021,791

(22) PCT Filed: Sep. 11, 2014

(86) PCT No.: PCT/EP2014/069405
§ 371 (c)(1),
(2) Date: Mar. 14, 2016

(87) PCT Pub. No.: WO2015/036490
PCT Pub. Date: Mar. 19, 2015

(65) Prior Publication Data
US 2016/0221139 A1    Aug. 4, 2016

(30) Foreign Application Priority Data

Sep. 13, 2013    (EP) ..................................... 13184344

(51) Int. Cl.
*H05K 7/20*    (2006.01)
*B23Q 11/14*    (2006.01)
(Continued)

(52) U.S. Cl.
CPC ............ *B23Q 11/14* (2013.01); *B23Q 1/0045* (2013.01); *H05K 5/0017* (2013.01); *H05K 7/14* (2013.01)

(58) Field of Classification Search
CPC ............................ B23Q 11/141; H05K 5/0017
See application file for complete search history.

(56) References Cited

U.S. PATENT DOCUMENTS 5,634,351 A * 6/1997 Larson ................ F28D 15/0266
165/104.33
6,069,791 A * 5/2000 Goto ....................... G06F 1/203
165/104.33
(Continued)

FOREIGN PATENT DOCUMENTS

| CN | 2791733 Y | 6/2006 |
|---|---|---|
| DE | 202 04 448 U1 | 7/2002 |
| JP | H08-65825 A | 3/1996 |

OTHER PUBLICATIONS

Oct. 20, 2014 International Search Report issued in International Patent Application No. PCT/EP2014/069405.
(Continued)

*Primary Examiner* — Anthony Q Edwards
(74) *Attorney, Agent, or Firm* — Oliff PLC

(57) ABSTRACT

A control console of a numerically controlled machine tool having a housing, a screen, at least one circuit board that has electrical components, and a cooling device that includes a cooling channel, through which a fluid can be conducted, the cooling channel extending within the housing between at least two openings in the housing.

12 Claims, 3 Drawing Sheets

Figure 1:
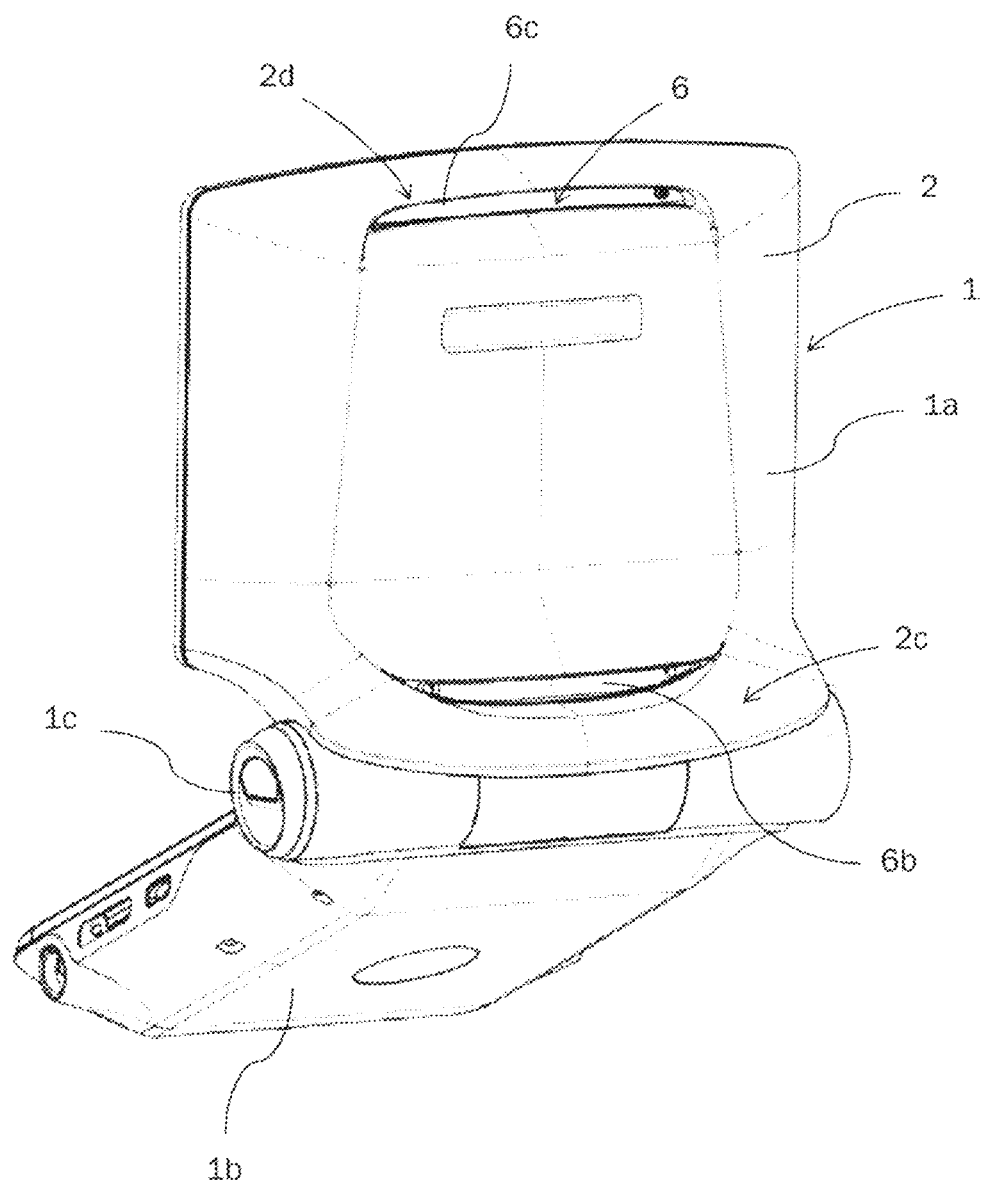

(51) Int. Cl.
*B23Q 1/00* (2006.01)
*H05K 5/00* (2006.01)
*H05K 7/14* (2006.01)

(56) References Cited

U.S. PATENT DOCUMENTS

| | | | | |
|---|---|---|---|---|
| 7,028,753 | B2 * | 4/2006 | Sterner | F28D 15/02 |
| | | | | 165/121 |
| 7,457,113 | B2 * | 11/2008 | Kumhyr | G06F 1/203 |
| | | | | 165/80.3 |
| 7,859,841 | B2 * | 12/2010 | Tamura | G06F 1/203 |
| | | | | 361/679.06 |
| 8,259,448 | B2 * | 9/2012 | Furukawa | H04N 5/64 |
| | | | | 313/582 |
| 8,605,428 | B2 * | 12/2013 | MacDonald | G06F 1/203 |
| | | | | 165/104.33 |
| 2012/0057290 | A1 * | 3/2012 | Shen | G06F 1/181 |
| | | | | 361/679.22 |
| 2013/0319638 | A1 * | 12/2013 | Degner | G06F 1/20 |
| | | | | 165/104.21 |

OTHER PUBLICATIONS

Jan. 23, 2017 Office Action issued in Chinese Patent Application No. 201480050550.2.

* cited by examiner

CONTROL CONSOLE FOR A NUMERICALLY CONTROLLED MACHINE TOOL

The present invention relates to a control console for a numerically controlled machine tool having an integrated cooling device.

Control consoles for numerically controlled machine tools (CNC-computerized numerical control) are known in the prior art and have a screen and a physical keyboard and/or a plurality of control buttons. The hardware of the control console is often external to the control console, e.g. in the form of a control computer which is connected to the control console by means of a cable connection.

An object of the present invention is to create a compact, efficiently and intuitively operated control console of a numerically controlled machine fool.

In order to achieve this object, a control console according to claim 1 is proposed by the invention. Other preferred further developments of the invention are described in the dependent claims.

According to the invention, a control console for controlling a numerically controlled machine tool is proposed, comprising a housing, a screen arranged on the front side in the housing, at least one circuit board having electrical components, and a cooling channel, through which a fluid can be conducted. According to the invention, the cooling channel is arranged between the circuit board and a rear wall of the housing and extends within the housing between a lower opening and an upper opening, and the openings are formed in the rear wall of the housing.

The operation of the machine tool is improved on account of the control console which can be operated in a more intuitive and less complex way. The operability of the control console is additionally supported by the more compact design of the control console, which is achieved in particular by a compact and efficient cooling device. The control console according to the invention has integrated computer hardware together with a compact and efficient cooling device and can simultaneously be operated in a more intuitive and ergonomic fashion.

Therefore, the inventive control console of a numerically controlled machine tool can have at least one housing, at least one screen and at least one circuit board having electrical components. Furthermore, at least one cooling device can be comprised. The cooling device can have a cooling channel, through which a fluid can be conducted. The cooling channel can extend within the housing between at least two openings in the housing.

The screen can preferably be a flat screen, i.e. a screen with small depths, e.g. compared to a cathode ray tube. The screen is preferably an LCD, TFT, plasma, LED and/or OLED screen.

The circuit board or also pc board preferably has one or more storage elements, one or more microprocessors or microcontrollers and a plurality of conductor paths. More preferably, the circuit board forms together with electric components a computer which can be used e.g. to control the functions of the control console, of the screen and/or of further units. The circuit board is preferably arranged behind the screen in a plane parallel to the screen plane.

In a preferred embodiment, the fluid is air, more preferably ambient air, which flows from the environment of the control console into the cooling channel and flows out of the cooling channel back into the environment, in particular advantageously as a result of a naturally resulting thermal chimney effect, where heated air rises in the channel and flows out of the upper outlet opening, as a result of which cooler ambient air of the industrial hall is sucked into the lower outlet opening. In such an embodiment, the advantage is that is not required to provide active cooling elements, such as fans or other rotating blowers.

The advantage of the control console according to the invention is that a compact, intuitively operated control console is created, which is also achieved on account of the arrangement and design of the cooling device. For example, the entire cooling efficiency, which is in particular required to dissipate the heat generated by the screen and the electronic components of the circuit board, is preferably ensured by the compact cooling device. The cooling device according to the invention here requires preferably no moving parts or the like to conduct a fluid flow through the cooling channel. In particular on account of the temperature difference between the ambient air temperature and the air temperature within the cooling channel, a fluid flow system through the cooling channel is rather preferably established, in particular by means of natural convection.

Furthermore, the circuit board can be substantially arranged between the screen and the cooling channel within the housing, and therefore the cooling channel can dissipate the heat generated by the screen and the electrical components of the circuit board very efficiently. The cooling channel can preferably substantially be arranged parallel to circuit board and screen surface.

It is also preferred for the screen to be touch-sensitive, i.e. e.g. the screen can be made as what is called as a touch-screen. The screen is preferably touch-sensitive and designed such that control commands of an operator for controlling a numerically controlled machine tool connectable to the control console can be inputted by touching the screen.

The screen can be configured in such a way that e.g. control commands for controlling a numerically controlled machine tool connectable to the control console can be inputted by touching the screen or approaching the screen. This permits that the operation is possible with particular intuition since the user can directly input his control commands on or at the screen, simultaneously receives a display of the entire important information on the screen and no external keyboard or the like is required.

Furthermore, the circuit board, the screen and the cooling device can be arranged in the same housing of the control console. 'In the same housing' means that a housing accommodates the components jointly. The housing can be made of several parts or one part. The arrangement of the components in the same housing allows that the control console can be carried out in an even more compact way.

Furthermore, the screen can be arranged on the front side of the housing. The at least two openings can be arranged on a rear side of the housing. An at least first opening can be arranged in the region of a lower edge of the housing and an at least second opening can be arranged in the region of an upper edge of the housing. The cooling channel can be arranged between the first opening and the second opening.

"Region of a lower edge" of the housing refers substantially to a lower section of the housing and "region of an upper edge" refers substantially to an upper section of the housing which preferably includes the edge of the housing and a section around the edge. This arrangement of the cooling channel inlet or outlet further supports the manifestation of a natural convection flow from the ambient air through the cooling channel; since on account of the waste heat of the screen and the electronic components the air within the cooling channel is warmer than the ambient air, the ambient air is sucked into the cooling channel.

Furthermore, the control console and/or the housing can have a base and/or a connecting section. An opening of the cooling channel can also (or alternatively) be provided in the region of the base or connecting portion, in particular and preferably, when the base and/or the connecting portion is arranged below the lower edge of the housing.

Furthermore, fins can be arranged on the circuit board and/or in the region of the circuit board and can at least in part protrude into the cooling channel. The fins can have a thermally conductive material.

'At least in part protruding into the cooling channel' can mean e.g. that the fins protrude into the cooling channel up to e.g. half the cooling channel height. Furthermore, it is possible that the fins protrude into the cooling channel up to a quarter or three quarter of the cooling channel height. Furthermore, the term 'fins' does not exclude other structures, such as needle-like, cylindrical and/or hollow parts. A relevant technical function is the dissipation of heat from the electronic components and/or the circuit board to the cooling channel. The fins preferably have a thermally conductive material, such as metal, in particular copper or aluminum.

Furthermore, the cooling device can comprise an active cooling element which can set the fluid within the cooling channel in motion, and therefore the fluid can flow from the first opening to the second opening. The active cooling element can be e.g. a fan, comparable to a CPU blower, for example, which can be arranged within the cooling channel and further enhances the fluid flow which is present on account of natural convection. Therefore, the dissipation of heat can also be improved.

Furthermore, at least one side wall of the cooling channel can be formed by a rear wall of the housing. A side wall of the cooling channel which can be arranged adjacent to the circuit board can also be formed in open fashion or can be formed by means of a wall element.

'Side wall' refers here to the wall which forms or covers a lateral surface of the cooling channel. The cooling channel can also have inter alia a closed lateral surface, and therefore the fluid can flow between the openings only within the cooling channel.

The wall element is in the preferred case a plate-like element, e.g. made of metal which is connected to the housing, in particular preferably to the rear wall of the housing and thus forms or covers a side wall of the cooling channel.

A closed lateral surface means substantially that the fluid flow can only pass through the openings in the housing, which form inlet and outlet to the cooling channel. In other words, a closed lateral surface thus means substantially that the fluid flow cannot pass through the side surfaces or walls of the cooling channel. The advantage is that the fluid within the housing only flows within the cooling channel and thus has a high flow rate with accompanying high heat transfer coefficient. Therefore, the heat dissipation is further improved. An at least partly open lateral surface, in turn, allows that fins can be guided from the region where the circuit board is arranged into the cooling channel and/or that fluid can flow directly to the circuit board where it effects direct cooling of the components.

The closed lateral surface can be realized e.g. by means of a hollow profile that can be arranged between the openings within the housing. Furthermore, side walls can also be formed e.g. by means of individual plate-like elements, e.g. the wall element or the rear wall of the housing.

Furthermore, the rear wall of the housing can have a substantially non-flat form, at least in the region of the cooling channel. The wall element can have a substantially flat form, at least in the region of the cooling channel. For example, the cooling channel, in particular having a closed lateral surface, can only be formed by means of the housing wall and the wall element.

The rear wall of the housing can e.g. be substantially elliptic, hemispherical or generally bent or folded, and therefore the side walls of the cooling channel can only be formed by means of the another plate-like wall element.

The advantage is that no further components or walls have to be formed or provided, as a result of which a less complex and more compact design of the cooling device and thus the control console becomes possible.

The wall element of the cooling channel can have a receiving opening, and therefore the fins can be arranged in such a way that the fins can protrude into the cooling channel by the receiving opening.

When fins are provided, they can protrude through one or more lateral surfaces of the cooling channel. For this purpose, e.g. through-holes can be provided in the lateral surfaces and receive the fins preferably in a precisely fitting fashion. It is also possible to provide gaskets at the points at which the fins penetrate the lateral surface to prevent an escape of fluid flow on the lateral surfaces in the region of the fins.

Furthermore, the circuit board can be arranged within a device housing. The device housing can be arranged between the screen and the cooling channel in such a way that electrical components which can be attached to the at least a circuit board, can be arranged in the direction of a wall of the device housing, which can border directly on the fluid cooling channel. The device housing is preferably a closed box or a box that is open on one side, which accommodates the circuit board and the components attached thereto. In particular in the case that the cooling channel is not confined between the openings by means of side walls, a wall of the device housing can simultaneously serve as a side wall for confining the cooling channel. The alignment of the electrical components in the direction of the cooling channel has the advantage that thermal radiation is mainly already emitted in the direction of the cooling device.

The device housing can preferably consist of metal or a thermally well conducting material. Fins can e.g. protrude from an interior of the device housing into the cooling channel. Alternatively or additionally, the fins can be arranged on an outer portion of the device housing and protrude into the cooling channel.

In addition, the first opening can be a fluid inlet opening and the second opening can be a fluid outlet opening. The first opening can have a larger cross-section than the second opening. The surface area of the cooling channel cross-section can be reduced from the first opening towards the second opening. The advantage which results from the larger cross-section of the first opening is that the fluid can be accelerated within the cooling channel, in particular in the case of a correspondingly adapted cooling channel form, and therefore the heat dissipation is further improved.

Furthermore, the cooling channel cross-section can be reduced from the first opening to the second opening, wherein cooling channel portions with enlarged cooling channel cross-section and cooling channel portions with tapered cooling channel cross-section can alternately be arranged between the first opening and the second opening within the cooling channel. This arrangement of alternately larger and smaller cross-sections in the flow direction of the fluid effects a repeated acceleration and deceleration of the flow speed so as to produce turbulences within the fluid flow which further improve the heat dissipation.

Moreover, a cooling channel width, transversely to a flow direction of the fluid, and a cooling channel length, along the flow direction of the fluid, can be larger than a height of the cooling channel. Due to this shaping of the cooling channel it is in particular possible that the cooling channel has a flat design, and therefore the control console can be designed in compact fashion with respect to a good operability, and simultaneously a large volume of the fluid can be transported through the cooling channel to ensure great heat dissipation.

The width of the cooling channel can here encompass substantially the entire rear surface of the housing or be smaller. For example, a width of the cooling channel is preferred which has about ⅓ to ⅔ of the width of the rear side of the housing.

The length of the cooling channel is substantially determined by the arrangement of the openings in the housing and preferably occupies the length from the lower edge to the upper edge of the housing or less.

Furthermore, precisely one fluid inlet opening and precisely one fluid outlet opening of the cooling channel can be provided and the two openings have a substantially slot-like cross-section. Due to this arrangement, a very compact and simultaneously highly effective cooling channel can be provided.

The screen, the circuit board and the cooling channel can be arranged within the same one-piece housing part of the housing of the control console of the machine tool.

In a particularly useful embodiment, at least one side wall of the cooling channel is formed by the housing rear wall of the housing and another side wall of the cooling channel which is arranged adjacent to the circuit board, is preferably formed by means of a wall element which is fastened to the housing rear wall of the housing. The advantage is that the ventilation channel can be formed in one fabrication step by inserting the wall element in the housing and fastening it e.g. by a screw connection and/or an adhesive joint. This is in particular extremely useful when the wall element simultaneously forms a support structure for the circuit board and the screen and the circuit board and the screen are attached during fabrication in a first step to the wall element, e.g. by a screw connection and/or an adhesive joint and then the entire screen unit comprising the screen, the circuit board and the wall element are inserted as a unit in the housing and fastened, thereby simultaneously forming the channel.

The housing rear wall of the housing here preferably has, at least in the region of the cooling channel, a substantially non-flat form, in particular an outwardly bulged or concave form, and the wall element has, at least in the region of the cooling channel, a substantially flat form, such that the cooling channel can be formed by attachment of the wall element to the rear wall of the housing. The advantage here is that the channel can be formed by merely placing and attaching the wall element in the housing.

The wall element of the cooling channel preferably has one or more receiving openings, through which cooling fins protrude into the cooling channel.

The surface area of the cross-section of the cooling channel is preferably reduced from the lower opening to the upper opening. This further improves the natural action of the thermal chimney effect.

A horizontal width of the cooling channel is preferably larger than or equal to a horizontal width of the circuit board, such that the circuit board can preferably be cooled by a fluid flow via the entire width thereof.

In summary, it is possible by means of the invention that the control console according to the invention has an optimum operability for a numerically controlled machine tool, which becomes possible in particular on account of the arrangement and the design of the cooling device and of the screen of the control console according to the invention.

Figure 2:
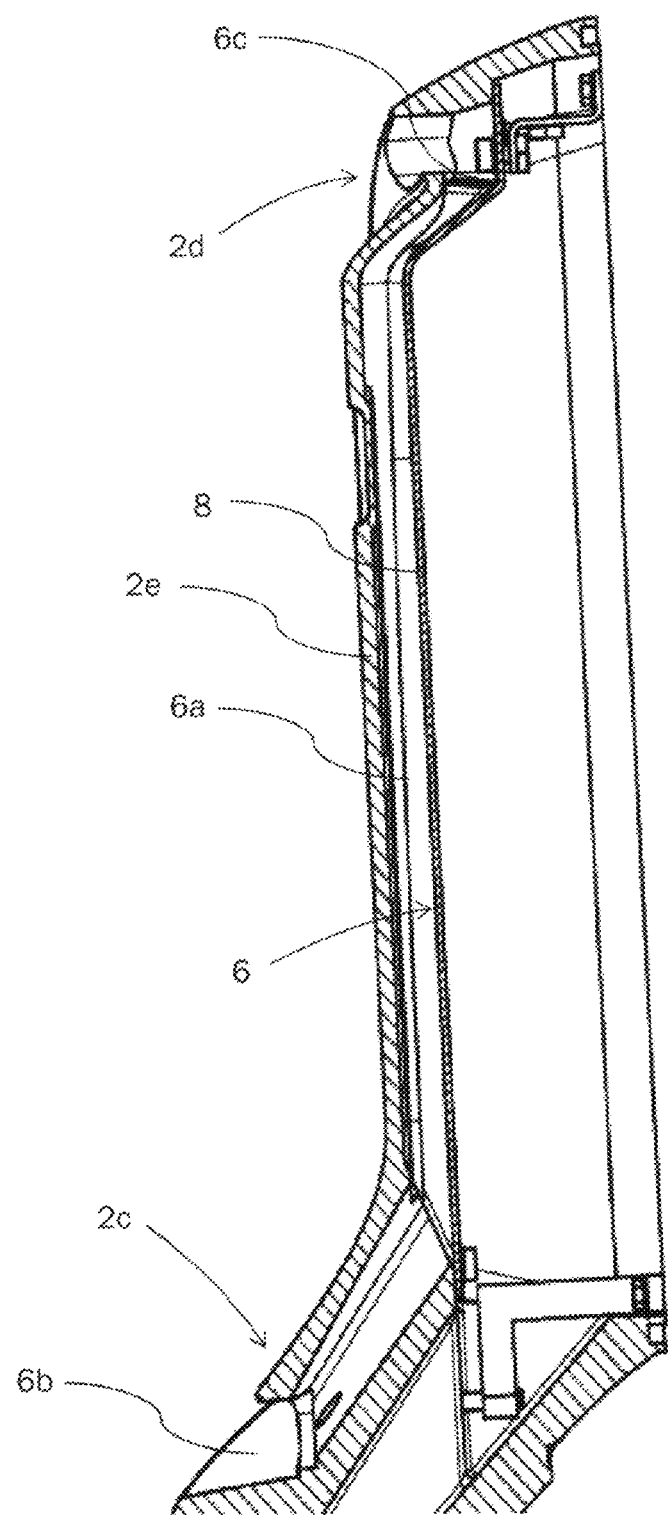
Figure 3:
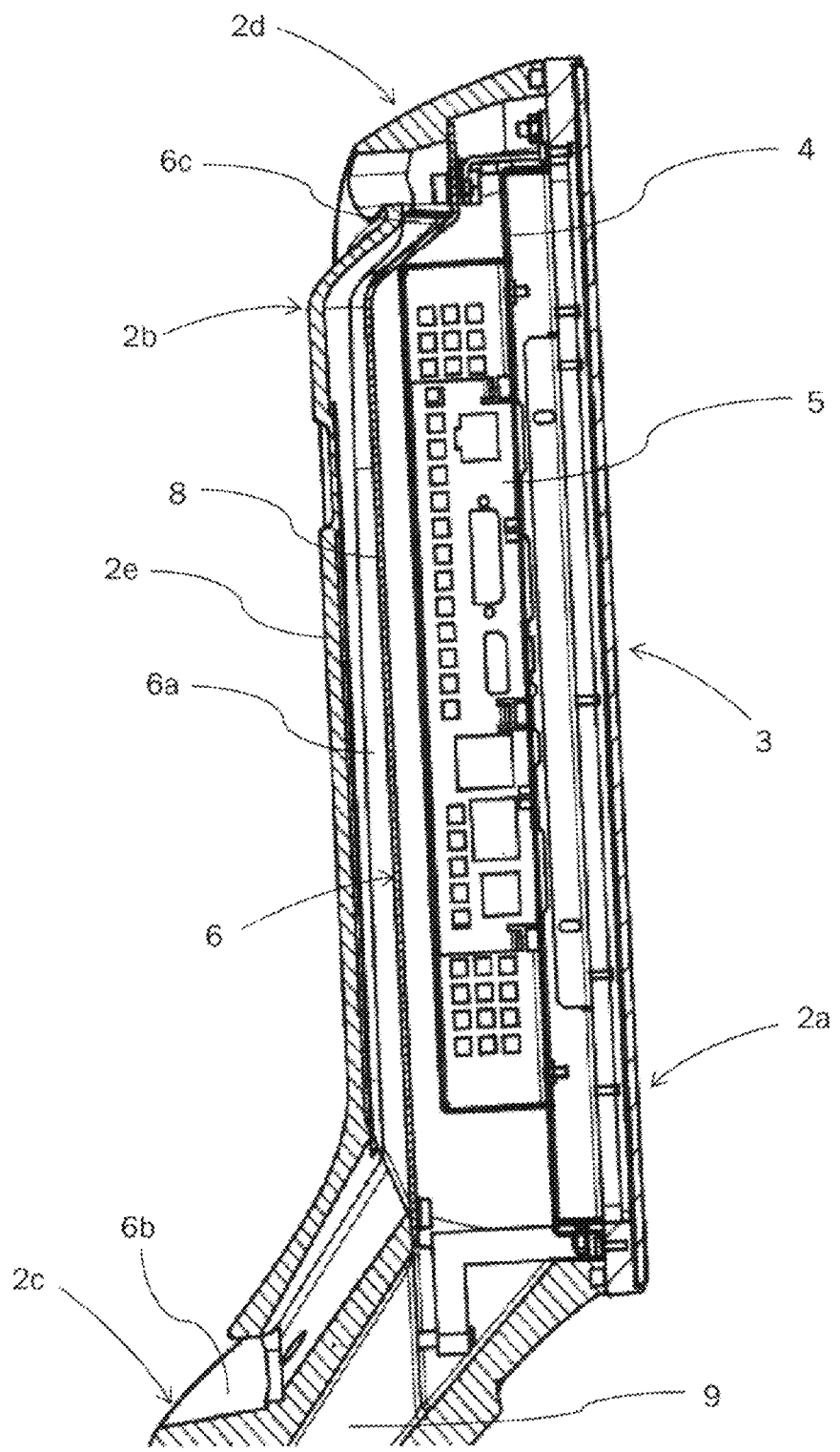

The invention is described by way of example below with reference to the enclosed, diagrammatic drawings, wherein FIG. 1 shows a perspective view of the control console according to the invention, FIG. 2 shows a cross-section of the control console according to the invention, and FIG. 3 shows another cross-section of the control console according to the invention.

Various examples of the present invention are described in detail below with reference to the drawings. Equal and similar elements in the FIGS. are here designated by equal reference signs. However, the present invention is not limited to the described design features but also comprises modifications of features of the described examples and combination of features of various examples on the basis of the scope of the independent claims.

FIG. 1 shows the control console according to the invention for a numerically controlled machine tool in a perspective view. The shown control console has an upper part 1a and a lower part 1b, which can be pivoted about a swivel axis at any angle relative to one another. The swivel axis is provided by means of a pivot bearing 1c. Both parts of the control console 1, i.e. the upper part 1a and the lower part 1b, can have in each case a screen 3 and/or keyboard elements for operating and inputting control commands. The design is described by way of example below according to which the upper part 1a has a screen 3, as also shown in FIG. 3. Since such a screen and the associated computer components produce and dissipate a large amount of heat to drive e.g. the screen 3, an effective dissipation of the generated heat is necessary. According to the invention, the generated heat is dissipated by means of a cooling device 6, which is preferably provided on a housing rear side 2b of a housing 2 of the control console 1.

FIG. 1 shows the rear side 2b of the housing and the slot-like openings 6b and 6c of a cooling channel 6a, which is part of the cooling device 6 an is arranged within the housing 2. The perspective diagram of the rear side of the control console 1 according to FIG. 1 shows in particular with respect to the housing 2 of the upper part 1a that the housing 2 is made of several parts. However, a one-part design of the housing 2 is also possible. In order to better understand the function of the cooling device 6, FIG. 2 shows a cross-section through the upper part 1a of the control console 1, still without a circuit board 4 having electronic components 5, e.g. CPUs and/or GPUs, and also without a screen 3 on a front side 2a of the housing. FIG. 2 shows in particular the pathway of the cooling channel 6a of the cooling device 6 which in the design shown has a fluid inlet 6b and a fluid outlet 6c in the form of openings. A lower edge 2c of the housing 2 of the upper part 1a has here the opening 6b which is preferably a fluid inlet. The upper edge 2d of the housing of the upper part 1a has the opening 6c, which is preferably a fluid outlet.

It is also shown in FIG. 2 that the rear wall 2e of the housing closes off part of the cooling channel 6a to the outside. As additionally illustrated by the contour lines in FIG. 1, the rear wall 2e of the housing has a slight curvature in the transverse axis to the housing 2. This shaping of the rear wall 2e of the housing allows that a lateral surface of the cooling channel 6a can be fully closed with preferably only a further element, the wall element 8. FIG. 2 shows the wall element which is preferably a thin sheet or plastic part and separates a receiving region for the circuit board 4 and the electronic components 5 and the screen 3 of the housing 2 from the cooling channel 6a. The wall element 8 is respectively connected to the housing 2 in the region of a lower edge and upper edge 2c, 2d of the housing 2 by means of e.g. screw connections. However adhesive joints or plug-in connections can also be used to connect the wall element 8 to the housing 2.

Furthermore, FIG. 2 and also FIG. 3 show that the cooling channel 6a between the openings 6b and 6c substantially has a shape of an elongated "S" or an integral sign, and therefore the cooling channel 6a preferably follows the shaping of the housing 2 of the upper part 1a of the control console 1. In addition, the cooling channel 6a is arranged in a section of the housing 2, which receives the screen 3 and the circuit board 4, substantially parallel to the screen 3 (see FIG. 3).

Moreover, the opening 6b preferably has a larger cross-section than the opening 6c, as shown in FIGS. 2 and 3, and the cooling channel part which adjoins the opening 6b in the flow direction of a fluid, also has a larger cross-section than the portion of the cooling channel 6a, which is arranged in the flow direction of the opening 6c, and therefore an acceleration effect of the cooling fluid is generated, which is preferably air. This acceleration effect can be further enhanced by means of an active cooling element (not shown), e.g. a fan, which is arranged in the cooling channel 6a, and therefore the convective heat exchange or heat dissipation is further increased.

The figures do not show that the wall element 8 can have a recess, and therefore a through-opening is present between the cooling channel 6a and the receiving region of the housing 2, in which the electronic components 5 and the screen 3 are arranged. As a result of this receiving opening, fins 7 (not shown), which are communicate with the electronic components 5 and/or the circuit board or boards 4, can be guided into the cooling channel 6a. The fins 7, which protrude at least partly into the cooling channel 6a through the receiving opening, further improve the heat exchange between the heat generators and the fluid which removes the generated heat.

Finally, FIG. 3 shows the cross-section according to FIG. 2 together with the mounted electronic components 5, which are arranged on one or more circuit boards 4, and a screen 3, which is connected to the housing front side 2a of the housing 2, e.g. by means of a shown screw connection. The screen 3 is, as shown, a flat screen, preferably on the basis of an LCD technique, TFT technique, plasma technique of OLED technique, it is particularly preferred for the screen to also be touch-sensitive, and therefore control commands can directly be inputted on the screen by means of an approach to the screen or touch of the screen.

FIG. 3 also shows that the circuit board is connected to the housing 2 by means of a screw connection. The electronic components are arranged on the circuit board 4 in such a way that the electronic components 5 are arranged in the direction of the housing rear side 2b, i.e. in the direction of the cooling channel 6a. This also supports an optimum dissipation of the heat generated by the electronic components 5, said heat being largely dissipated on account of the orientation of the electronic components 5 in the direction of the cooling channel 6a.

Furthermore, it is shown in FIG. 3 that a portion of the housing 2 in the region of the lower edge 2c has an additional cooling channel 9. This additional cooling channel 9 can also be suitable for feeding cooling fluid, e.g. air, into the housing 2, and therefore an even more enhanced cooling effect can be obtained.

In summary, it is noted that in particular on account of the very compact design of the cooling device 6 with the cooling channel 6a, a compact control console 1 is provided, which can thus also be operated with less effort. At the same time, an optimum dissipation of the generated heat is achieved by means of the not very complex design of the cooling channel 6a of the cooling device 6. Due the touch-sensitive, flat screen 3, the operation of the control console 1 can be particularly intuitive.

The invention claimed is:

1. A control console for controlling a numerically controlled machine cool, comprising:
   a housing,
   a screen arranged on the front side in the housing,
   at least one circuit board with electrical components, and
   a cooling channel, through which a fluid can flow, wherein:
      the cooling channel is arranged between the circuit board and a rear wall of the housing and runs inside the housing between a lower opening and an upper opening, and the openings are formed in the rear wall of the housing, and
      at least one side wall of the cooling channel is formed by the housing rear wall of the housing and a further side wall of the cooling channel, which is arranged adjacent to the circuit board, is formed by a wall element provided between the circuit board and the housing rear wall of the housing.

2. The control console according to claim 1, wherein the circuit board is arranged between the screen and the cooling channel within the housing.

3. The control console according to claim 1, wherein the screen, the circuit board and the cooling channel are arranged within a same one-piece housing part of the housing of the control console of the machine tool.

4. The control console according to claim 1, wherein the screen is arranged on a housing front side portion of the housing and the two openings are arranged on a housing rear side portion of the housing wherein the lower opening is arranged in the region of a lower edge of the housing and the upper opening is arranged in the region of an upper edge of the housing.

5. The control console according to claim 1, wherein cooling fins are arranged on the circuit board and protrude at least in part into the cooling channel, wherein the cooling fins have a thermally conductive material.

6. The control console according to claim 1, wherein the wall element is fastened to the housing rear wall of the housing.

7. The control console according to claim 1, wherein the housing rear wall of the housing has a substantially non-flat shape at least in the region of the cooling channel and the wall element has a substantially flat shape at least in the region of the cooling channel, such that the cooling channel can be formed by attachment of the wall element to the rear wall of the housing.

8. The control console according to claim 5, wherein the wall element of the cooling channel has one or more receiving openings, through which cooling fins protrude into the cooling channel.

9. The control console according to claim 1, wherein the lower opening is a fluid inlet opening and the upper opening is a fluid outlet opening,
   wherein the lower opening has a larger cross-sectional area than the upper opening.

10. The control console according to claim 9, wherein the surface area of the cross-section of the cooling channel is reduced from the lower opening to the upper opening.

11. The control console according to claim 1, wherein a horizontal width of the cooling channel is larger than or equal to a horizontal width of the circuit board.

12. The control console according to claim 1, wherein the screen is touch-sensitive and designed to input control commands of an operator for controlling a numerically control machine tool connectable to the control console by means of touching the screen.

\* \* \* \* \*